United States Patent
Ali et al.

(10) Patent No.: US 7,328,417 B2
(45) Date of Patent: Feb. 5, 2008

(54) CELL-BASED METHOD FOR CREATING SLOTTED METAL IN SEMICONDUCTOR DESIGNS

(75) Inventors: Anwar Ali, San Jose, CA (US); Tauman T. Lau, San Jose, CA (US); Kalyan Doddapaneni, Mt. View, CA (US)

(73) Assignee: LSI Logic Corporation, Milpitas, CA (US)

( * ) Notice: Subject to any disclaimer, the term of this patent is extended or adjusted under 35 U.S.C. 154(b) by 423 days.

(21) Appl. No.: 10/732,395

(22) Filed: Dec. 9, 2003

(65) Prior Publication Data

US 2005/0125759 A1   Jun. 9, 2005

(51) Int. Cl.
   *G06F 9/45*   (2006.01)
(52) U.S. Cl. ............................... 716/9; 716/10; 716/11; 716/12; 716/13; 716/14
(58) Field of Classification Search .................... 716/9, 716/10, 14; 257/401, 208; 438/197, 129; 700/182
   See application file for complete search history.

(56) References Cited

U.S. PATENT DOCUMENTS

| | | | | |
|---|---|---|---|---|
| 5,929,469 A | * | 7/1999 | Mimoto et al. | 257/208 |
| 5,999,861 A | * | 12/1999 | Dove et al. | 700/182 |
| 6,312,980 B1 | * | 11/2001 | Rostoker et al. | 438/197 |
| 6,407,434 B1 | * | 6/2002 | Rostoker et al. | 257/401 |
| 6,567,328 B1 | * | 5/2003 | Higuchi | 365/205 |
| 6,734,046 B1 | * | 5/2004 | Dahl | 438/129 |
| 6,823,501 B1 | * | 11/2004 | Dahl | 716/9 |
| 2003/0079194 A1 | * | 4/2003 | Igarashi et al. | 716/8 |

* cited by examiner

Primary Examiner—Jack Chiang
Assistant Examiner—Helen Rossoshek
(74) Attorney, Agent, or Firm—Strategic Patent Group, PC

(57) ABSTRACT

A computer-implemented method for creating slotted metal structures in a semiconductor design is disclosed. Aspects of the present invention include providing a library of different types of pre-slotted building block elements. Thereafter, during chip design, a plurality of the elements are selected from the library and placed in the design in abutment to form a composite slotted metal structure.

38 Claims, 7 Drawing Sheets

CELL-BASED METHOD FOR CREATING SLOTTED METAL IN SEMICONDUCTOR DESIGNS

FIELD OF THE INVENTION

The present invention relates to semiconductor design and fabrication, and more particularly to a method and system for creating slotted metal structures in circuit designs during fabrication.

BACKGROUND OF THE INVENTION

Modern semiconductor manufacturing processes require that metal busses, nets, wires, and various other structures that are larger than a certain size be slotted. Slotting metal includes creating holes in these metal structures so that the end result resembles a mesh or waffle like pattern. The metal line is then no longer contiguous. Rules for metal slotting are typically complex. There is typically a minimum and maximum size for a slot (hole), for spacing between slots, and for spacing of the furthermost slot to the metal boundary. Other more complex rules can apply and are process specific.

Typically, the criteria that is used to establish if a metal wire must be slotted, is defined in terms of metal width and metal length. If any metal wire found in a semiconductor design is wider than width W, and at the same time, longer than length L, it must be slotted. Length L is defined to be in the same direction as the current flow. Width W is defined to be perpendicular to the current flow. L and W parameters apply to contiguous sections of metal on the same layer. FIG. 1 is a diagram illustrating the metal slotting definition applied to three metal wires A, B, and C. Metal wire A does not require slotting because its width and length are less than the width and length constraints (W, L), while metal wire B and C require slotting because their dimensions exceed the width and length constraints.

When a metal wire exceeds the width and length constraints, the wire is slotted by creating square holes, known as slots, inside the metal area of the wire. FIG. 2 is a diagram illustrating a metal wire 10 both before and after slots 12 are created during the slotting process.

Additionally, many constraints are imposed on the design rules for these metal slots 12, as shown in FIG. 3. Slot design rule constraints include rules for the minimum and maximum length of a slot 12 (sL), the minimum and maximum width of a slot 12 (sW), minimum and maximum spacing between slots 12 (sS), minimum and maximum between the outermost slot and the metal boundary (sB), minimum and maximum alignment between neighboring slots 12 (sA), and minimum and maximum spacing between the edge of any slot 12 and the edge of coincident metal wires (sC). Note that lengths are measured parallel to the direction of current flow in a wire, and widths are measured perpendicular.

Density constraints are also imposed, requiring that the area of slots 12 as a percentage of the total metal wire area, should be within minimum and maximum values. Actual values for all these parameters, as well as precise definitions, will vary according to specific semiconductor fabrication processes. Additionally, some processes may impose further slotting constraints than those defined here.

During semiconductor chip design, it is often necessary to create metal structures, which owing to their width, length, or other topology constraint, become subject to metal slotting rules. The challenge has been to create semiconductor chips that by design must use large metal, which is subject to slotting rules, and to find a means to automatically slot these metal objects. In such cases, a solution is required to create slots in the metal structure in the following manner:

1. Owing to the number of metal structures that could require slotting in a modern semiconductor chip, the metal slotting solution should be automated.
2. The solution should meet the metal slotting rules.
3. The solution should be integrated in the design flow, simple to use, and be generic enough to adapt to slotting rule changes.
4. It should be possible to account for the electrical impact of removing metal to meet slotting rules. The impact should be seen as early in the design flow as possible.
5. There are many physical combinations to slot a given metal structure, all of which will still meet slotting rules. Chip or circuit designers may have specific preferences on how a given metal structure should be slotted. Adequate control of the exact slotting solution for each metal object should be provided.
6. The solution must be capability of handling complex metal topologies, including metal structures of multiple vertices where each vertex as a unique wire width.

Currently, there are several slotting approaches that attempt to meet the above requirements. One approach is to simply avoid having to perform slotting. Where possible in the chip design, metal structures are created to be sufficiently narrow or short, such that they do not require metal slotting. The advantage of this approach is that no metal slotting is required, therefore no solution to metal slotting is required. One disadvantage is that restricting chip and circuit designers to create metal structure smaller than certain topologies will limit electrical performance, density, and many other design considerations. In practice, it is not a complete solution. Another disadvantage is that if metal slotting rules change, such that metal width and/or length thresholds are reduced, design practices for avoidance must be changed. This is not a sustainable solution since existing cells and chips must be entirely redesigned.

Another slotting approach is referred to as post-processing automation. Post-processing automation approaches may be performed manually or automatically with a software tool in which all metal objects in a design database are examined to determine which subset of objects are sufficiently large to require slotting.

FIG. 4 is a diagram illustrating example metal objects before post-processing automation. One metal wire 10a is of sufficient size to require metal slotting, while the other metal wire 10b is not. For the metal wire 10a requiring slotting, the tool inserts slots 12 in to the metal wire 10a to meet required slotting rules, as shown in FIG. 5, which shows the metal wire 10a after post-processing automation. This tool can only be run after all metal wiring for the entire chip-layout is complete.

The post-processing automation approach has several disadvantages. First, post-processing automation tools are challenged when dealing with metal structures containing multiple vertices and/or multiples widths. This is because slotting rules typically require that slots must be aligned in at least one direction around a metal bend. Respecting this alignment often violates metal slot-to-metal boundary rules.

FIG. 6 is a diagram illustrating possible violations of slot design rule constraints for a metal wire having multiple vertices. Slot 2 may be governed by rule that states that slot 2 must aligned with slot 1. If this rule is met, however, slot 2 may then violate a slot boundary (sB) rule that requires a slot to be within a minimum/maximum distance to the metal boundary, as shown. If additional slots are introduced, then slot-to-slot spacing (sS) rules may also be violated, as shown for slots 3, 4, and 5.

Another disadvantage is that post-processing automation is further challenged with structures containing multiple staircased edges, or non-mahattan polygons. It is not uncommon to see automation methods violate one slotting rule while trying to meet another. FIG. 7 is a diagram illustrating a metal structure have staircase or non-manhattan shaped boundaries. With such a structure, one or more slotting rules sA, sB, sC, sS, sL, and sW may be violated while the tools attempts to meet others.

Significant algorithm design, and automation development is required to support these complex scenarios. The disadvantage is that the algorithms must be adjusted and tools updated when new metal routing scenarios are encountered.

Even if an automation tool is able to meet the complexities of such metal topologies, another disadvantage is that the process of metal slotting can remove any vias present in the slotting area because the tool may have no means to control how vias are removed.

FIG. 8A is a diagram showing vias 14 on a metal structure 16 pior to post-processing automation, and FIG. 8B is a diagram showing the metal slotting solution intended by a designer. FIG. 8C shows the metal slotting solution chosen by tool, which removes critical vias 14. This may be undesirable to the circuit designer who may have preferred an alternate slotting layout that kept the vias 14 intact in critical areas.

Another drawback to post-processing slotting tools is that it is difficult to predict the electrical impact of slotting metal; this can only be done after the fact. This makes it difficult to plan for the electrical impacts such as resistance, inductance, and capacitance ahead of time, such as during early stages of the chip development or even during the development of the technology itself. This means that the design must be re-timed and reanalyzed to ensure it is meeting electrical constraints. This increases the number of iterations through timing closure or electrical analysis flows.

Accordingly, what is needed is an improved approach for creating slotted metal during semiconductor fabrication. The present invention addresses such a need.

SUMMARY OF THE INVENTION

The present invention provides a computer-implemented method for creating slotted metal structures in a semiconductor design. Aspects of the present invention include providing a library of different types of pre-slotted building block elements. Thereafter during chip design, a plurality of the building block elements are selected from the library and placed in the design in abutment to form a composite slotted metal structure.

According to the method disclosed herein, the present invention allows a designer to create highly irregular metal structures with as many jogs, staircase, or non-manhattan boundaries as the topology requires. In addition, providing a software tool that places building block cells is simpler to develop than automation for previous slotting approaches because post-processing steps are eliminated, thereby reducing development cost.

DETAILED DESCRIPTION OF THE INVENTION

Figure 1:
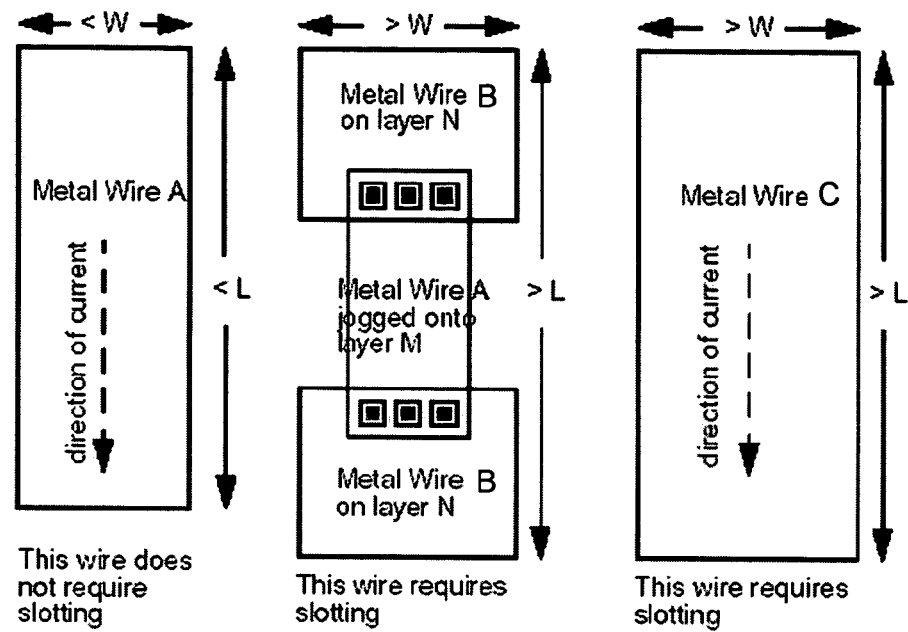
FIG. 1 is a diagram illustrating the metal slotting definition applied to three metal wires A, B, and C.
Figure 2:
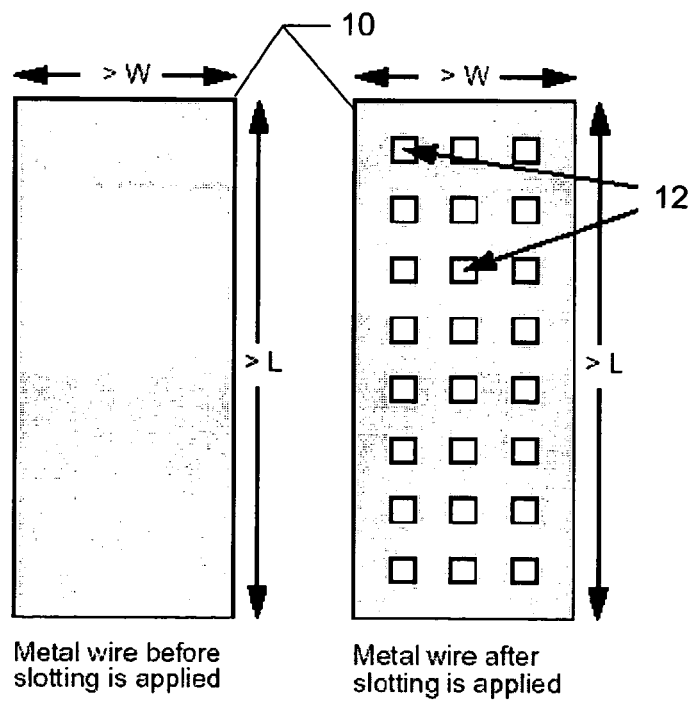
FIG. 2 is a diagram illustrating a metal wire both before and after slots are creating during the slotting process.
Figure 3:
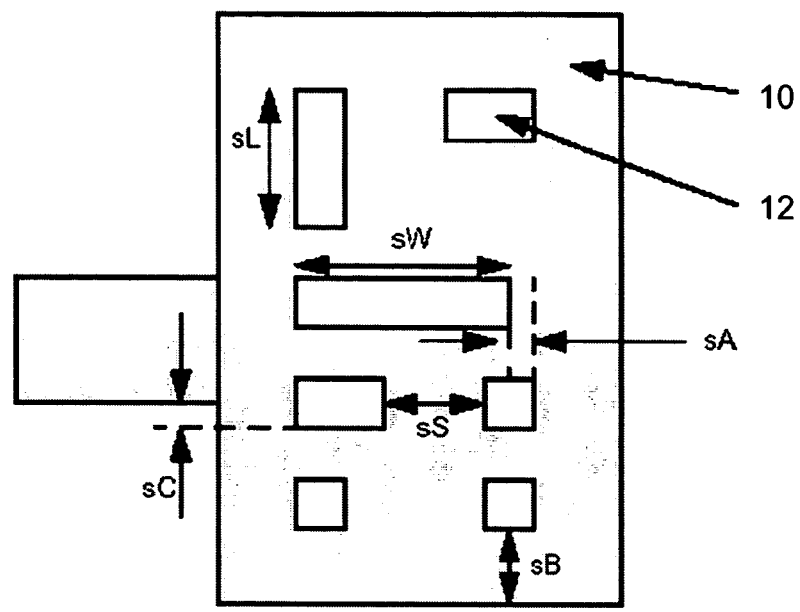
FIG. 3. is a diagram illustrating constraints imposed on the design rules for metal slots.
Figure 4:
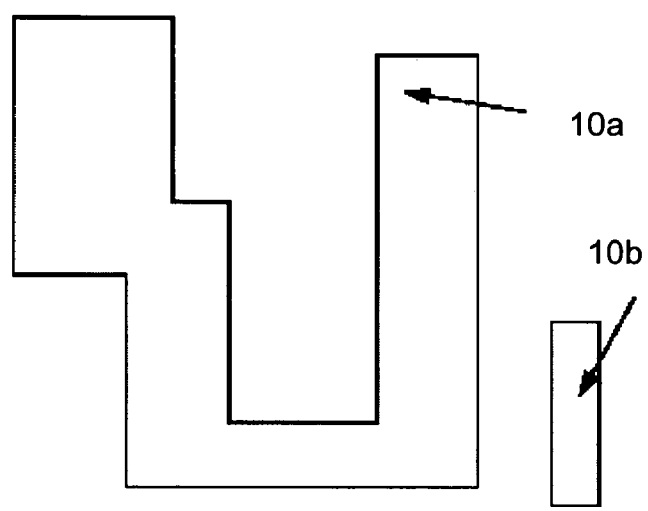
FIG. 4 is a diagram illustrating example metal objects before post-processing automation.
Figure 5:
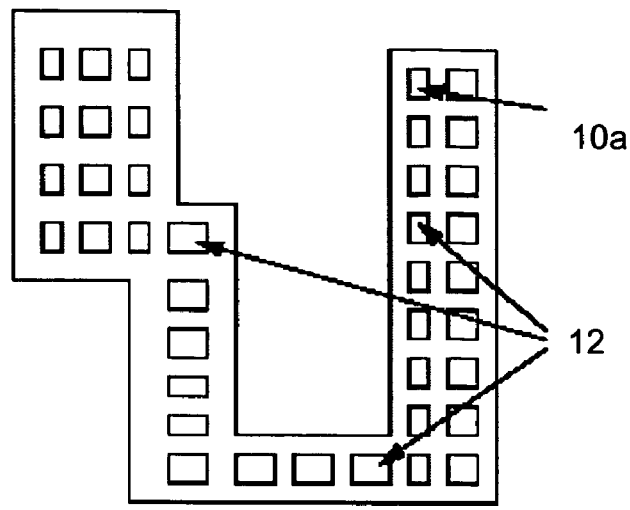
FIG. 5 is a diagram illustrating an example metal wire after being slotted during post-processing automation.
Figure 6:
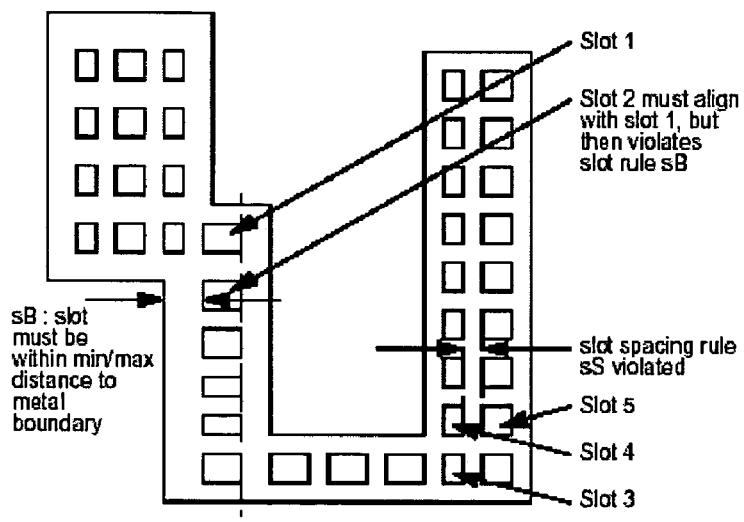
FIG. 6 is a diagram illustrating possible violations of slot design rule constraints for a metal wire having multiple vertices.
Figure 7:
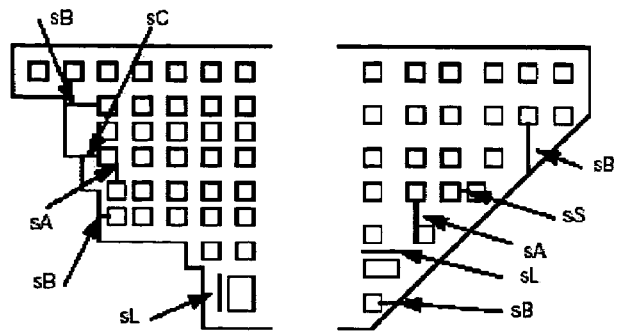
FIG. 7 is a diagram illustrating a metal structure have staircase or non-manhattan shaped boundaries.
Figure 8A:
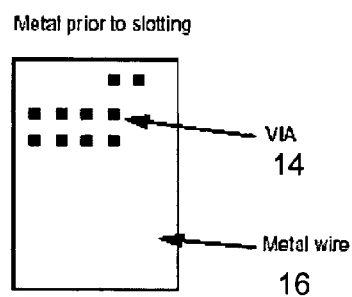
FIG. 8A is a diagram showing vias on a metal structure pior to post-processing automation.
Figure 8B:
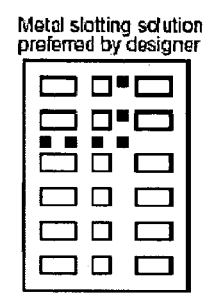
FIG. 8B is a diagram showing a metal slotting solution intended by a designer.
Figure 8C:
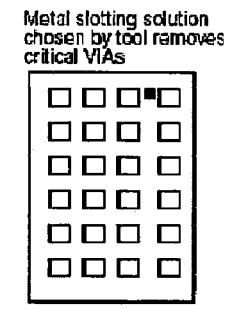
FIG. 8C is a diagram showing the metal slotting solution chosen by tool.

The present invention relates to a method and system for creating slotted metal structures during semiconductor fabrication. The following description is presented to enable one of ordinary skill in the art to make and use the invention and is provided in the context of a patent application and its requirements. Various modifications to the preferred embodiments and the generic principles and features described herein will be readily apparent to those skilled in the art. Thus, the present invention is not intended to be limited to the embodiments shown, but is to be accorded the widest scope consistent with the principles and features described herein.

As described above, current slotting approaches may be acceptable for simple metal shapes with only four edges. However, for complex metal shapes having more than four edges, such as L or S shaped metal interconnects have varying metal wire widths along each vertex, and current slotting tools are not always able to correctly respect slotting rules around metal bends.

In addition, current solutions are not always deterministic or easy to control. This is because the current methods typically assign slots dynamically. A circuit or chip designer may have a specific preference to the way a metal is slotted, but is unable to intercept the automation at this level. Metal slotting tools can also remove vias if they happen to be where a slot is created. This can unintentionally reduce the number of vias in the metal structure. And it is difficult to pre-estimate the R, L, or C, or slotted metal, such electrical characteristics can only be determined once the metal has been slotted, adding another post-processing step.

The present invention provides a cell-based method for creating slotted metal structures during semiconductor design and fabrication. In a preferred embodiment, the present invention is implemented as a slotted metal software tool that is separate, or part, of a routing tool, and is executed on a conventional workstation, PC, or server.

According to the present invention, the slotted metal tool allows a user to create a library of metal structures comprising different types of cells with pre-designed notches (castle-pins) on certain edges of each structure. A rich enough set of cells are created such that during chip design, an operator can select cells from the library, place the cells into the design in abutment, such that the cells are tessellated in various manners to create complex slotted metal structures, such as busses, or nets, which are slotted correct-by-construction. Automation can be used to correctly tile these cells within a design to create the slotted metal structures.

Providing a library of different types of pre-slotted elements that can be combined to form a metal structure of any shape provides several advantages. One advantage is that the present invention eliminates the need for complex tools to dynamically fracture contiguous wires and create slotted versions. Tool automation is limited to correct placement and abutment of a cell-based scheme. The present invention also provides the designer of each metal cell with full control over where slots are placed and can therefore safely place other interconnect structures, such as vias without the concern of them being removed. Another advantage is that the present invention overcomes the limitations of current approaches. This includes handling of slot creation around bends of S and L shaped metal structures. And, the cell-based approach of the present invention allows the metal electrical performance (Resistance, Capacitance, and Inductance) to be pre-characterized. The electrical performance of a composite structure can therefore be predicted before it is created, eliminating this from post-processing.

Figure 9:
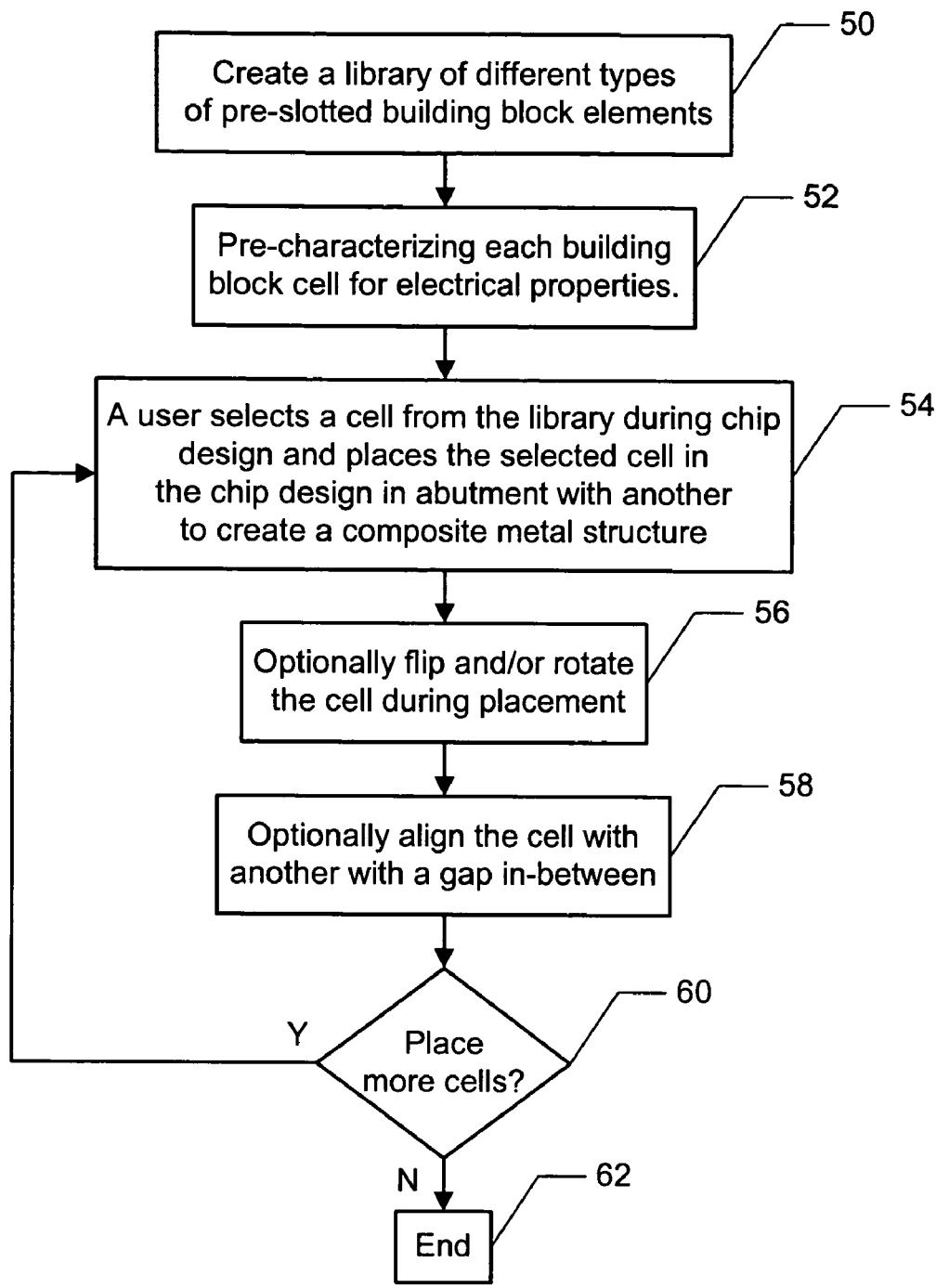
FIG. 9 is a flow diagram illustrating a process for creating slotted metal structures during semiconductor fabrication in accordance with one preferred embodiment of the present invention

FIG. 9 is a flow diagram illustrating a process for creating slotted metal structures during semiconductor fabrication in accordance with one preferred embodiment of the present invention. The process begins by creating a library 80 of different types of pre-slotted building block elements in step 50. In a preferred embodiment, the metal building elements are implemented as slotted metal cells.

Figure 10:
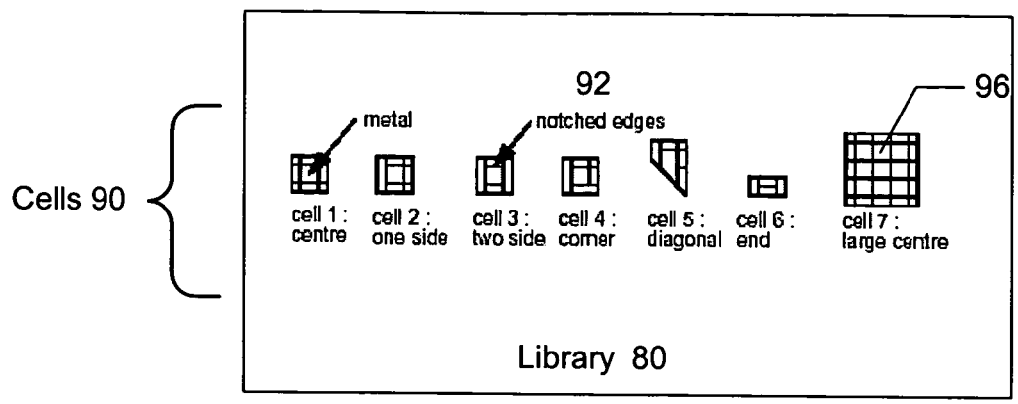
FIG. 10 is a diagram illustrating example types of routing block cells.

FIG. 10 is a diagram illustrating example types of slotted cells in the library 80. Each type of cell 90 includes at least three edges, where at least one of the edges includes a notch 92, such that when abutted with a notched edge of another cell, the notches create a slot. Thus, tiling cells 90 having notches 92 create a larger composite metal structure that is slotted correct-by-construction.

The example of FIG. 10 shows seven different cell types, cell 1-cell 7, defined in the library 80. Cell 1 is includes a metal center and notches 92 on all four edges. Cell 2 includes a metal center, one metal edge, and three notched edges. Cell 3 includes a metal center, two metal opposing edges, and two other notched opposing edges. Cell 4 includes a metal center, two adjacent metal edges, and two adjacent notched edges. Cell 5 includes a diagonal metal edge and two notched edges. Cell 6 is an end cell that includes three metal non-notched edges, and a slotted center. Besides having at least one notched edge, a large center cell 7 comprising multiple smaller cells may also include built-in internal slots 96.

The number of different types of cells 90 created in the library 80 depends on the particular application. However, the number of cells 90 must be sufficient enough to realize all common routing conditions, such as wide busses, and L, and S topologies, for a given design.

Referring again to FIG. 9, after the library of metal routing building block elements has been created, in step 52 each building block cell 90 is pre-characterized for electrical properties. After the library 80 has been created, the slotting tool is ready for use by designers during chip design. In a preferred embodiment, the slotted metal tool includes a user interface that not only enables the creation of a library of cells 90, but also enables a user to view the cells 96 in the library, select cells 90 with a cursor, and place the cells 90 in locations in the design. The user interface also allows the user to manipulate the cells 90, as described below. Any type of user interface could be used with the present invention and exact look and feel of a preferred user interface is outside the scope of the present invention.

Figure 11:
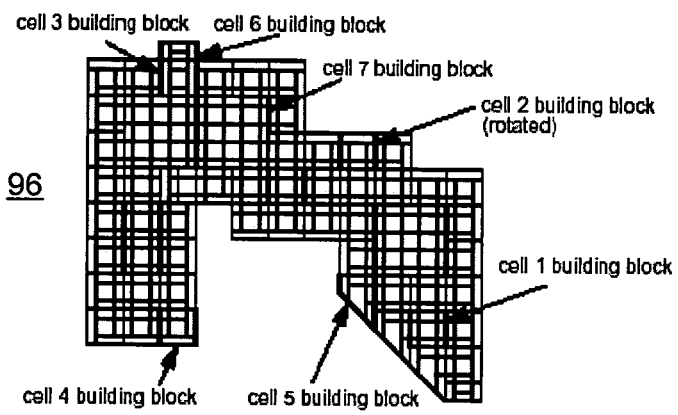
FIG. 11 is a diagram illustrating a composite metal structure created by tessellating cells from the library.

In step 54, during chip design, a user selects a cell 90 from the library and places the selected cell 90 in abutment in the chip design to create a composite metal structure of the required topology. FIG. 11 is a diagram illustrating a composite metal structure 96 created by tessellating cells 90 from the library 80. As shown, the structure 96 was created using various cell types from the library 80, including cells 1, 2, 3, 4, 5, 6, and 7.

Figure 12:
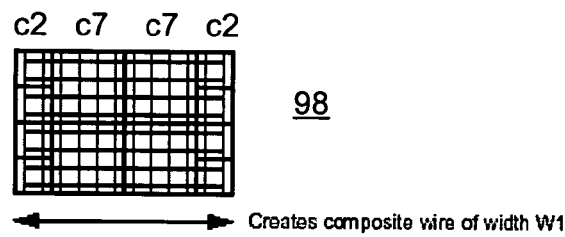
FIG. 12 is a diagram of a composite metal structure having a width W1, which was produced by tiling together columns of cell 2's and cell 7's.

In a preferred embodiment, the cells 96 in the library 90 are created with slotting granularity that is sufficiently small to allow creation of wires with multiple widths. FIG. 12 is a diagram of a composite metal structure 98 having a width W1, which was produced by tiling together columns of cell 2's and cell 7's.

Referring again to FIG. 9, during placement of the cell 90 in step 56, the user my optionally flip and/or rotate the cell 96, which reduces the number of cells needed in the library 80. In addition, the cells 96 do not have to be perfectly tiled. That is, in step 58, the user may optionally align the cell 96 to another cell 96 with small gaps in-between to achieve even more granularity on the control of wire widths.

Figure 13:
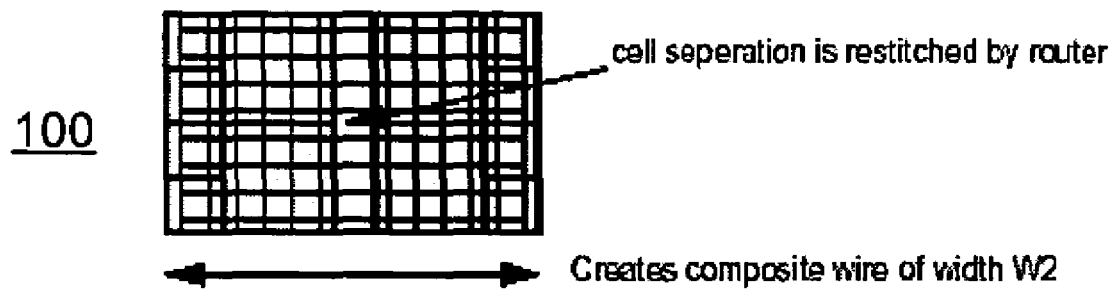
FIG. 13 is a diagram illustrating a composite metal structure in which two columns of cell 7's have been tiled with gaps in between to provide the structure with a wire width of W2.
Figure 14:
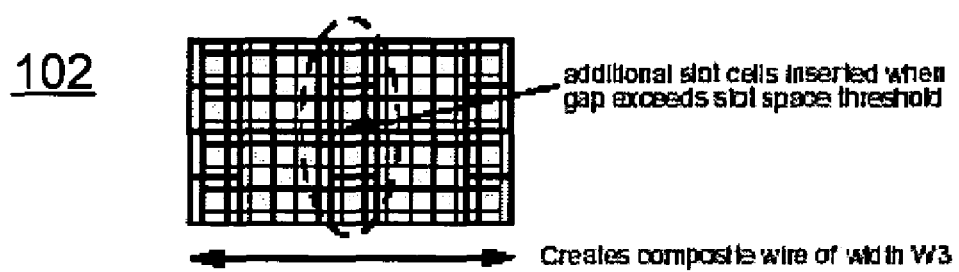
FIG. 14 a diagram illustrating a composite metal structure in which additional cells are inserted in the gap between two columns of cell 7's to provide the structure with a wire width of W3.

FIG. 13 is a diagram illustrating a composite metal structure 100 in which two columns of cell 7's have been tiled with gaps in between to provide the structure 100 with a wire width of W2. A traditional router can be used to stitch the notched metal edges 92 of the cells 90 together. If the gap between slot cells 90 is sufficiently large, then a slot cell 90 is inserted between. FIG. 14 a diagram illustrating a composite metal structure 102 in which additional cells are inserted in the gap between two columns of cell 7's to provide the structure 100 with a wire width of W3.

Referring again to FIG. 9, if the user wishes to select and place another cell 90 in step 60, then the process continues at step 54 until the user finishes, in which case the process ends in step 62.

In an alternative embodiment of the present invention, rather than tiling predefined slotted cells 90 to create large slotted structures, existing large metal structures may be inserted into a design in a conventional manner and thereafter, a slotting tool operating in accordance with the present invention is run that examines the design and replaces each existing large metal structure with an appropriate slotted cells. In addition, a designer can use a combination of both methods. For example, slotted cells 90 can be placed in critical locations where a metal structure is intended to jog, and a traditional router can then be used to route the notched edges of each cell to form a slotted structure.

Many advantages are provided by the slotting tool of the present invention. One advantage is that complexity limitations of traditional slotting tools are removed. By creating an appropriately rich slot cell library 80, wires of any topology can be constructed with as many jogs, staircase, or non-manhattan boundaries as required. This allows the designer to create highly irregular metal structures which where previously avoided or compromised due to limitations of conventional metal slotting automation. In addition, the slotting tool of the present invention that places building block cells is simpler to develop than automation for previous slotting approaches because post-processing steps are not required. This reduces development cost and simplifies algorithm design to a simpler cell tiling problem.

A related advantage is that since slot cells 90 are pre-designed, the circuit designer can choose the most optimal slotting arrangement for the required application rather than depend on a dynamic slotter-based solution which makes these choices. This allows the designer to fine-tune the metal electrical characteristics of various composite metal structures.

Another advantage is that since slot cells 90 are placed to create the composite wire, vias will only be placed on metal. No vias are removed because of slotting because the slots 96 are pre-designed into the metal cells 90.

A further advantage is that since the slot cells 90 are pre-designed, the electrical behavior of a composite wire can be accurately calculated as the wire is created. This is important to achieve a single-pass timing closure or electrical analysis flow, and avoids the need for iteration found in previous methods.

The present invention has been described in accordance with the embodiments shown, and one of ordinary skill in the art will readily recognize that there could be variations to the embodiments, and any variations would be within the spirit and scope of the present invention. Accordingly, many modifications may be made by one of ordinary skill in the art without departing from the spirit and scope of the appended claims.

We claim:

1. A method for creating slotted metal structures in a semiconductor design, comprising;
    (a) providing a library of different types of pre-slotted building block elements, wherein the building block elements comprise cells;
    (b) during chip design, selecting a plurality of the elements from the library and placing the elements in the design in abutment to form a composite slotted metal structure;
    (c) providing each type of cell with predefined notches on at least one edge thereof, such that when abutted with a notched edge of another element, the notches create a slot; and
    (d) stitching the edges of the cells together using a routing tool.

2. The method of claim 1 wherein step (a) further includes the step of: providing the library with a first type of cell comprising a metal center and four notched edges.

3. The method of claim 2 wherein step (a) further includes the step of: providing the library with a second type of cell comprising a metal center, one metal edge, and three notched edges.

4. The method of claim 3 wherein step (a) further includes the step of: providing the library with a third type of cell comprising a metal center, two metal opposing edges, and two notched opposing edges.

5. The method of claim 4 wherein step (a) further includes the step of: providing the library with a fourth type of cell comprising a metal center, two adjacent metal edges, and two adjacent notched edges.

6. The method of claim 5 wherein step (a) further includes the step of: providing the library with a fifth type of cell comprising a diagonal metal edge and two notched edges.

7. The method of claim 6 wherein step (a) further includes the step of: providing the library with a sixth type of cell comprising a slotted center and three metal edges.

8. The method of claim 7 wherein step (a) further includes the step of: providing the library with a seventh type of cell comprising multiple smaller cells and having built-in internal slots.

9. The method of claim 1 wherein step (a) further includes the step of: after the library of cells has been provided, pre-characterizing each of the cells for electrical properties.

10. The method of claim 1 further including the step of: implementing steps (a) and (b) as a slotting software tool that includes a user interface that enables a user to create the library of cells, and also enables a user to view the cells in the library, select cells, and place the cells in locations in the design during chip design.

11. The method of claim 10 wherein the slotting software tool enables the user to manipulate the cells, including flipping and rotating selected cells, thereby reducing the number of cells needed in the library.

12. The method of claim 10 wherein large metal structures are first inserted into the design and thereafter, the slotting tool is used to examine the design and replace each existing large metal structure with appropriate slotted cells.

13. The method of claim 1 wherein step (b) further includes the step of: allowing the user to align cells with gaps in-between.

14. A computer-readable medium containing program instructions for creating slotted metal structures in a semiconductor design, the program instructions for;
    (a) providing a library of different types of pre-slotted building block elements, wherein the building block elements comprise cells;
    (b) during chip design, selecting a plurality of the elements from the library and placing the elements in the design in abutment to form a composite slotted metal structure; and
    (c) providing each type of cell with predefined notches on at least one edge thereof, such that when abutted with a notched edge of another element, the notches create a slot; and
    (d) stitching the edges of the cells together using a routing tool.

15. The computer-readable medium of claim 14 wherein instruction (a) further includes the instruction of: providing the library with a first type of cell comprising a metal center and four notched edges.

16. The computer-readable medium of claim 15 wherein instruction (a) further includes the instruction of: providing the library with a second type of cell comprising a metal center, one metal edge, and three notched edges.

17. The computer-readable medium of claim 16 wherein instruction (a) further includes the instruction of: providing the library with a third type of cell comprising a metal center, two metal opposing edges, and two notched opposing edges.

18. The computer-readable medium of claim 17 wherein instruction (a) further includes the instruction of: providing the library with a fourth type of cell comprising a metal center, two adjacent metal edges, and two adjacent notched edges.

19. The computer-readable medium of claim 18 wherein instruction (a) further includes the instruction of: providing the library with a fifth type of cell comprising a diagonal metal edge and two notched edges.

20. The computer-readable medium of claim 19 wherein instruction (a) further includes the instruction of: providing the library with a sixth type of cell comprising a slotted center and three metal edges.

21. The computer-readable medium of claim 20 wherein instruction (a) further includes the instruction of: providing the library with a seventh type of cell comprising multiple smaller cells and having built-in internal slots.

22. The computer-readable medium of claim 14 wherein instruction (a) further includes the instruction of: after the library of cells has been provided, pre-characterizing each of the cells for electrical properties.

23. The computer-readable medium of claim 14 further including the instruction of: implementing instructions (a) and (b) as a slotting software tool that includes a user interface that enables a user to create the library of cells, and also enables a user to view the cells in the library, select cells, and place the cells in locations in the design during chip design.

24. The computer-readable medium of claim 23 wherein the slotting software tool enables the user to manipulate the cells, including flipping and rotating selected cells, thereby reducing the number of cells needed in the library.

25. The computer-readable medium of claim 23 wherein large metal structures are first inserted into the design and thereafter, the slotting tool is used to examine the design and replace each existing large metal structure with appropriate slotted cells.

26. The computer-readable medium of claim 14 wherein instruction (b) further includes the instruction of: allowing the user to align cells with gaps in-between.

27. A slotting software tool for creating slotted metal structures in a semiconductor design comprising:

a library of different types of pre-slotted building block elements, wherein the building block elements comprise cells, and wherein each type of cell has predefined notches on at least one edge thereof, such that when abutted with a notched edge of another element, the notches create the slotted metal structure, wherein a routing tool is used to stitch the edges of the cells together; and a user interface that enables a user to view the building block elements in the library, select a plurality of building block elements, and to place the plurality building block elements in locations in a design during chip design.

28. The software tool of claim 27 wherein the library is provided with a first type of cell comprising a metal center and four notched edges.

29. The software tool of claim 28 wherein the library is provided with a second type of cell comprising a metal center, one metal edge, and three notched edges.

30. The software tool of claim 29 wherein the library is provided with a third type of cell comprising a metal center, two metal opposing edges, and two notched opposing edges.

31. The software tool of claim 30 wherein the library is provided with a fourth type of cell comprising a metal center, two adjacent metal edges, and two adjacent notched edges.

32. The software tool of claim 31 wherein the library is provided with a fifth type of cell comprising a diagonal metal edge and two notched edges.

33. The software tool of claim 32 wherein the library is provided with a sixth type of cell comprising a slotted center and three metal edges.

34. The software tool of claim 33 wherein the library is provided with a seventh type of cell comprising multiple smaller cells and having built-in internal slots.

35. The software tool of claim 27 wherein after the library of cells has been created, the software tool enables the user to pre-characterize each of the cells for electrical properties.

36. The software tool of claim 35 wherein the slotting software tool enables the user to manipulate the cells, including flipping and rotating selected cells, thereby reducing the number of cells needed in the library.

37. The software tool of claim 35 wherein large metal structures are first inserted into the design and thereafter, the slotting tool examines the design and replaces each existing large metal structure with appropriate slotted cells.

38. The software tool of claim 27 wherein the software tool enables the user to align cells with gaps in-between.

* * * * *